US012574004B2

(12) United States Patent
Okunaga

(10) Patent No.: US 12,574,004 B2
(45) Date of Patent: Mar. 10, 2026

(54) ACOUSTIC WAVE DEVICE

(71) Applicant: Murata Manufacturing Co., Ltd.,
Nagaokakyo (JP)

(72) Inventor: Hiromu Okunaga, Nagaokakyo (JP)

(73) Assignee: MURATA MANUFACTURING CO.,
LTD., Kyoto (JP)

( * ) Notice: Subject to any disclaimer, the term of this
patent is extended or adjusted under 35
U.S.C. 154(b) by 168 days.

(21) Appl. No.: 18/420,932

(22) Filed: Jan. 24, 2024

(65) Prior Publication Data

US 2024/0171151 A1 May 23, 2024

Related U.S. Application Data

(63) Continuation of application No.
PCT/JP2022/035936, filed on Sep. 27, 2022.

(30) Foreign Application Priority Data

Sep. 29, 2021 (JP) ................................. 2021-159456

(51) Int. Cl.
*H03H 9/13* (2006.01)
*H03H 9/02* (2006.01)
(Continued)

(52) U.S. Cl.
CPC ........ *H03H 9/132* (2013.01); *H03H 9/02228*
(2013.01); *H03H 9/173* (2013.01); *H03H*
*9/175* (2013.01); *H03H 9/568* (2013.01)

(58) Field of Classification Search
CPC ........ H03H 9/175; H03H 9/173; H03H 9/568;
H03H 9/132; H03H 9/02228
See application file for complete search history.

(56) References Cited

U.S. PATENT DOCUMENTS 9,093,979 B2 * 7/2015 Wang ..................... H10N 30/40
10,979,019 B2 * 4/2021 Giner De Haro ...... H03H 9/145
(Continued)

FOREIGN PATENT DOCUMENTS

CN 112054781 A * 12/2020 ............... H03H 9/19
JP 2005217818 A 8/2005
(Continued)

OTHER PUBLICATIONS

International Search Report in PCT/JP2022/035936, mailed Dec.
27, 2022, 3 pages.
(Continued)

*Primary Examiner* — Quan Tra
(74) *Attorney, Agent, or Firm* — Keating & Bennett, LLP

(57) ABSTRACT

An acoustic wave device includes a first IDT electrode on a
first main surface of a piezoelectric layer, and a second IDT
electrode on a second main surface of the piezoelectric layer.
The first IDT electrode includes first and second electrode
fingers. The second IDT electrode includes third and fourth
electrode fingers. The first and fourth electrode fingers
overlap each other with the piezoelectric layer interposed
therebetween. The second and third electrode fingers over-
lap each other with the piezoelectric layer interposed ther-
ebetween. A potential of the first electrode finger and that of
the fourth electrode finger are opposite to each other. A
potential of the second electrode finger and that of the third
electrode finger are opposite to each other.

19 Claims, 10 Drawing Sheets

(51) Int. Cl.
     *H03H 9/17*           (2006.01)
     *H03H 9/56*           (2006.01)

(56)                References Cited

U.S. PATENT DOCUMENTS

| | | | |
|---|---|---|---|
| 2016/0182007 A1 | 6/2016 | Bhattacharjee | |
| 2016/0352304 A1* | 12/2016 | Kadota | H03H 9/02559 |
| 2018/0156993 A1 | 6/2018 | Hiroshima et al. | |
| 2018/0287047 A1* | 10/2018 | Rinaldi | H10N 30/40 |
| 2020/0186119 A1* | 6/2020 | Yamamoto | H03H 9/02866 |
| 2021/0297060 A1 | 9/2021 | Omura et al. | |

FOREIGN PATENT DOCUMENTS

| | | | |
|---|---|---|---|
| JP | 2018092094 A | 6/2018 | |
| JP | 2021044835 A | 3/2021 | |
| WO | 9502279 A1 | 1/1995 | |
| WO | 2015137054 A1 | 9/2015 | |
| WO | 2018186240 A1 | 10/2018 | |
| WO | 2020116528 A1 | 6/2020 | |

OTHER PUBLICATIONS

Written Opinion in PCT/JP2022/035936, mailed Dec. 27, 2022, 4 pages.

* cited by examiner

ACOUSTIC WAVE DEVICE

CROSS REFERENCE TO RELATED APPLICATIONS

This application claims the benefit of priority to Japanese Patent Application No. 2021-159456 filed on Sep. 29, 2021 and is a Continuation application of PCT Application No. PCT/JP2022/035936 filed on Sep. 27, 2022. The entire contents of each application are hereby incorporated herein by reference.

BACKGROUND OF THE INVENTION

1. Field of the Invention

The present invention relates to acoustic wave devices, in each of which, an IDT electrode is provided on both main surfaces of a piezoelectric layer.

2. Description of the Related Art

In an acoustic wave device disclosed in Japanese Unexamined Patent Application Publication No. 2021-44835, an IDT electrode is provided on both main surfaces of a piezoelectric layer. Electrode fingers of the IDT electrode provided on one main surface and those of the IDT electrode provided on the other main surface match or overlap each other in a plan view. A busbar of the IDT electrode on one main surface and that of the IDT electrode on the other main surface match or overlap each other with the piezoelectric layer interposed therebetween.

In the acoustic wave device disclosed in Japanese Unexamined Patent Application Publication No. 2021-44835, to drive the IDT electrode on one main surface and that on the other main surface in opposite phases, it is necessary to extend wiring from one main surface and from the other main surface in opposite directions. A space for this wiring is thus required, which makes it difficult to reduce the size of the acoustic wave device.

Additionally, the busbar of the IDT electrode on one main surface and that on the other main surface that match or overlap each other with the piezoelectric layer interposed therebetween become in opposite phases. Capacitance is thus inevitably generated between the two IDT electrodes, which may lead to degradation of the characteristics.

SUMMARY OF THE INVENTION

Example embodiments of the present invention provide acoustic wave devices that are each able to be reduced in size and makes it unlikely to cause degradation of the characteristics.

An acoustic wave device according to an example embodiment of the present invention includes a support substrate and a piezoelectric layer. The piezoelectric layer is stacked on the support substrate directly or indirectly. The piezoelectric layer includes first and second main surfaces facing each other. The acoustic wave device includes a first IDT electrode on the first main surface of the piezoelectric layer and a second IDT electrode on the second main surface of the piezoelectric layer. The first IDT electrode includes first and second busbars facing each other, a plurality of first electrode fingers connected to the first busbar, and a plurality of second electrode fingers connected to the second busbar. The second IDT electrode includes third and fourth busbars facing each other, a plurality of third electrode fingers connected to the third busbar, and a plurality of plural fourth electrode fingers connected to the fourth busbar. The first busbar and the third busbar face each other with the piezoelectric layer interposed therebetween, and the second busbar and the fourth busbar face each other with the piezoelectric layer interposed therebetween. The first electrode fingers and the fourth electrode fingers overlap each other with the piezoelectric layer interposed therebetween, and the second electrode fingers and the third electrode fingers overlap each other with the piezoelectric layer interposed therebetween. A polarity of a potential of the first electrode fingers and a polarity of a potential of the fourth electrode fingers are opposite to each other. A polarity of a potential of the second electrode fingers and a polarity of a potential of the third electrode fingers are opposite to each other.

An acoustic wave device according to an example embodiment of the present invention includes a support substrate and a piezoelectric layer. The piezoelectric layer is stacked on the support substrate directly or indirectly. The piezoelectric layer includes first and second main surfaces facing each other. The acoustic wave device includes a first IDT electrode on the first main surface of the piezoelectric layer and a second IDT electrode on the second main surface of the piezoelectric layer. Each of the first IDT electrode and the second IDT electrode includes two comb-shaped electrodes interdigitated with each other. Each of the comb-shaped electrodes includes a plurality of electrode fingers and a busbar to which the plurality of electrode fingers are connected. The first IDT electrode and the second IDT electrode at least partially face each other with the piezoelectric layer interposed therebetween. In an electrode finger of the first IDT electrode and an electrode finger of the second IDT electrode which face each other with the piezoelectric layer interposed therebetween, a polarity of a potential of the electrode finger of the first IDT electrode and a polarity of a potential of the electrode finger of the second IDT electrode are opposite to each other. The first IDT electrode and the second IDT electrode are displaced from each other by about λ/2 in an acoustic wave propagating direction, where λ is a wavelength defined by a pitch of the electrode fingers.

According to example embodiments of the present invention, it is possible to provide acoustic wave devices that are each able to be reduced in size and reduce or prevent degradation of the characteristics.

DETAILED DESCRIPTION OF THE EXAMPLE EMBODIMENTS

Example embodiments of the present invention will be explained below with reference to the drawings through illustration of specific example embodiments.

The individual example embodiments disclosed in the specification are only examples. The structures and configurations described in different example embodiments may partially be replaced by or combined with each other.

Figure 1:
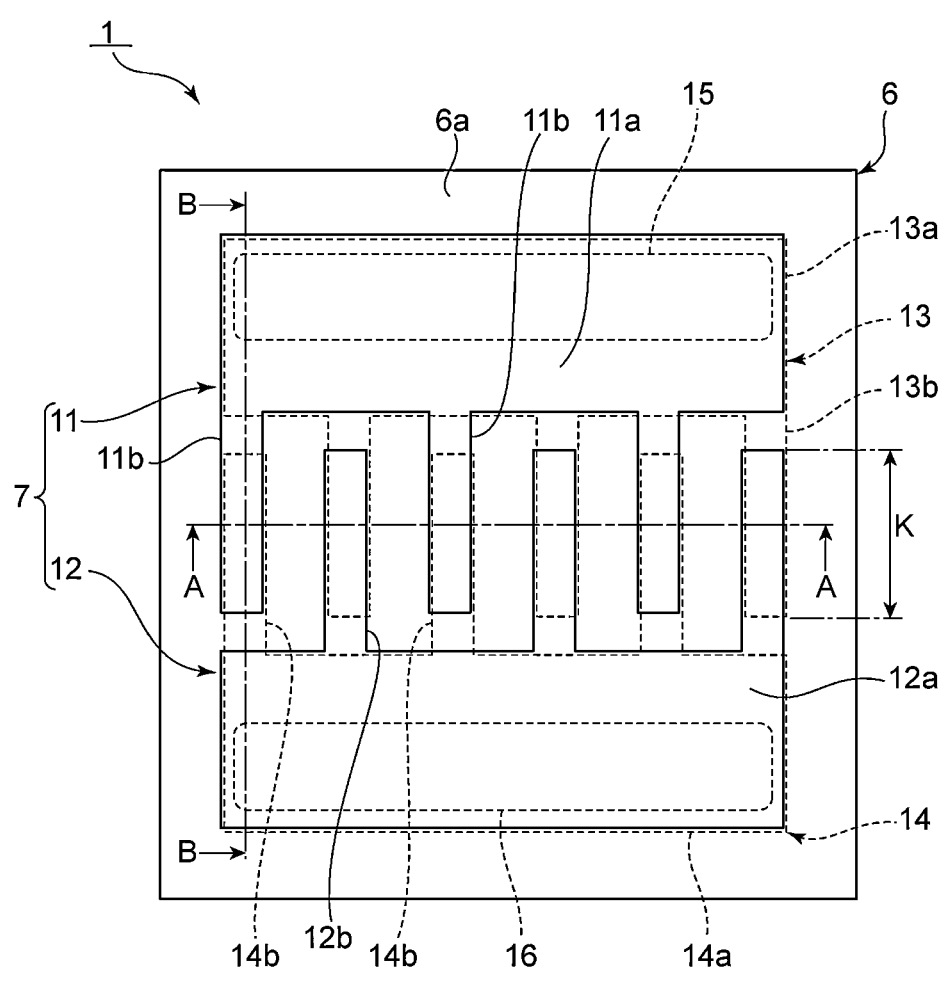
FIG. 1 is a plan view of an acoustic wave device according to a first example embodiment of the present invention.
Figure 2A:
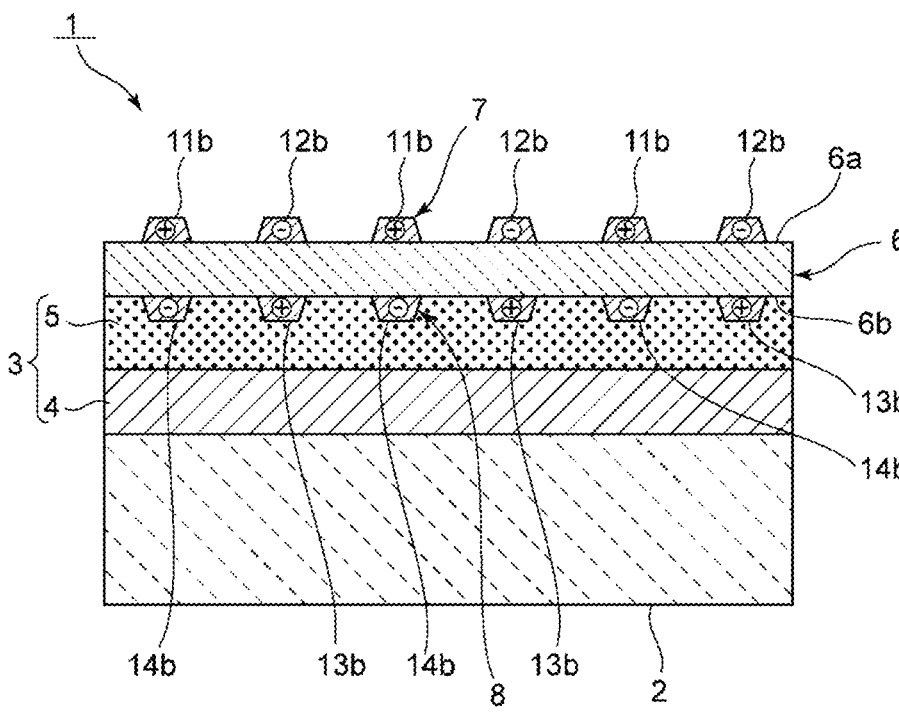
FIG. 2A is a sectional view taken along line A-A in FIG. 1.
Figure 2B:
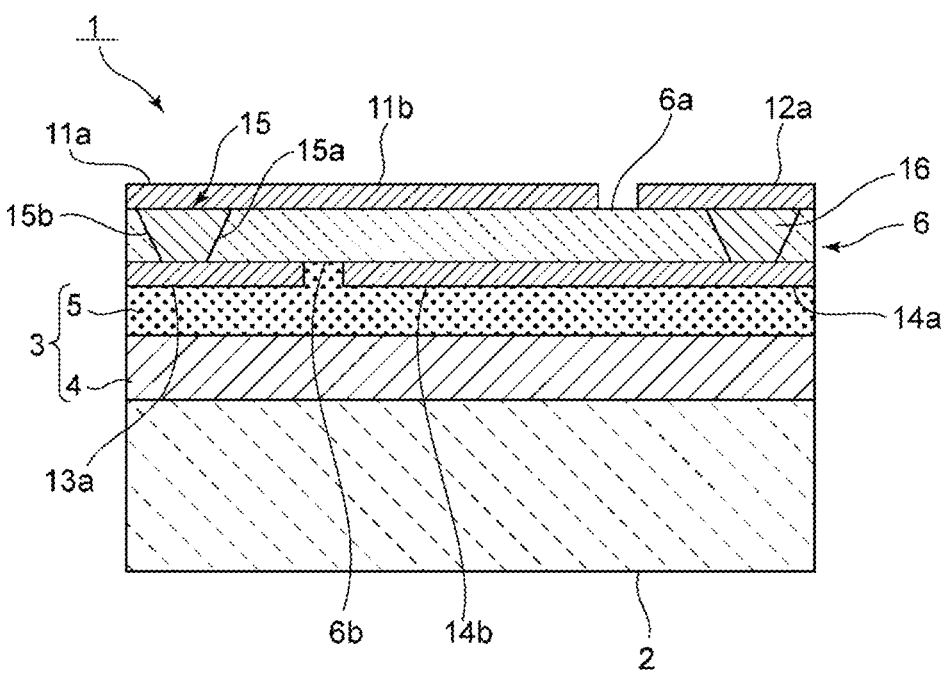
FIG. 2B is a sectional view taken along line B-B in FIG. 1.

FIG. 1 is a plan view of an acoustic wave device according to a first example embodiment of the present invention. FIG. 2A is a sectional view taken along line A-A in FIG. 1. FIG. 2B is a sectional view taken along line B-B in FIG. 1.

An acoustic wave device 1 includes a support substrate 2. The support substrate 2 is made of Si, for example. The support substrate 2 may be made of another suitable insulator or semiconductor.

An intermediate layer 3 is stacked on the support substrate 2. The intermediate layer 3 includes, for example, a silicon nitride film 4 and a silicon oxide film 5 stacked on the silicon nitride film 4. The silicon oxide film 5 is a low acoustic velocity material layer, which will be described later, while the silicon nitride film 4 is a high acoustic velocity material layer, which will be described later.

A piezoelectric layer 6 is stacked on the intermediate layer 3. The piezoelectric layer 6 includes first and second main surfaces 6a and 6b facing each other. The piezoelectric layer 6 is stacked on the intermediate layer 3 such that the second main surface 6b faces the intermediate layer 3. The piezoelectric layer 6 is made of, for example, $LiTaO_3$. The piezoelectric layer 6 may be made of another piezoelectric single crystal, such as $LiNbO_3$, for example.

A first IDT electrode 7 is provided on the first main surface 6a of the piezoelectric layer 6. A second IDT electrode 8 is provided on the second main surface 6b of the piezoelectric layer 6.

As illustrated in FIG. 1, the first IDT electrode 7 includes first and second comb-shaped electrodes 11 and 12. The electrodes indicated by the solid lines in FIG. 1 are the first and second comb-shaped electrodes 11 and 12. The electrodes indicated by the broken lines in FIG. 1 form the second IDT electrode 8.

The first comb-shaped electrode 11 includes a first busbar 11a and multiple first electrode fingers 11b. One end portion of each of the first electrode fingers 11b is connected to the first busbar 11a. The second comb-shaped electrode 12 includes a second busbar 12a and multiple second electrode fingers 12b. The first busbar 11a and the second busbar 12a face each other with a distance therebetween. One end portion of each of the second electrode fingers 12b is connected to the second busbar 12a. The multiple first electrode fingers 11b and the multiple second electrode fingers 12b are interdigitated with each other.

The direction perpendicular or substantially perpendicular to the extending direction of the first and second electrode fingers 11b and 12b is the acoustic wave propagating direction. As seen from this acoustic wave propagating direction, a region where the first and second electrode fingers 11b and 12b face each other is an interdigital region K.

The second IDT electrode 8 includes third and fourth comb-shaped electrodes 13 and 14.

The third comb-shaped electrode 13 includes a third busbar 13a and multiple third electrode fingers 13b. Similarly, the fourth comb-shaped electrode 14 includes a fourth busbar 14a and multiple fourth electrode fingers 14b. The multiple third electrode fingers 13b and the multiple fourth electrode fingers 14b are interdigitated with each other.

The first busbar 11a and the third busbar 13a face each other with the piezoelectric layer interposed therebetween, while the second busbar 12a and the fourth busbar 14a face each other with the piezoelectric layer interposed therebetween.

The first electrode fingers 11b and the fourth electrode fingers 14b overlap each other with the piezoelectric layer 6 interposed therebetween. The second electrode fingers 12b and the third electrode fingers 13b overlap each other with the piezoelectric layer 6 interposed therebetween. The potential of the first electrode fingers 11b and that of the fourth electrode fingers 14b are opposite polarities, while the potential of the second electrode fingers 12b and that of the third electrode fingers 13b are opposite polarities.

In FIG. 1, the positions of the third and fourth comb-shaped electrodes 13 and 14 located under the first and second comb-shaped electrodes 11 and 12 are slightly displaced from the first and second comb-shaped electrodes 11 and 12. This is merely to facilitate illustration, and in actuality, for example, the first and second comb-shaped electrodes 11 and 12 in the interdigital region and the third and fourth comb-shaped electrodes 13 and 14 in the interdigital region match or overlap each other in a plan view.

Regarding an electrode finger of the first IDT electrode 7 and that of the second IDT electrode 8 which overlap each other in a plan view, the potential of the electrode finger of the first IDT electrode 7 and that of the electrode finger of the second IDT electrode 8 are opposite polarities.

The wavelength defined by the electrode finger pitch of the first and second comb-shaped electrodes 11 and 12 and that of the third and fourth comb-shaped electrodes 13 and 14 is represented by $\lambda$. The electrode finger pitch is the center-to-center distance between adjacent electrode fingers connected to different potentials (between a first electrode finger 11b and a second electrode finger 12b, for example). The wavelength $\lambda$ is expressed by $\lambda=2p$, where p is the electrode finger pitch. In the first example embodiment, the first IDT electrode 7 and the second IDT electrode 8 are displaced from each other by, for example, about $\lambda/2$ in the acoustic wave propagating direction. This will be explained more specifically. For example, the first electrode fingers 11b extend from the first busbar 11a toward the second busbar 12a. In the cross section in FIG. 2B taken along line B-B in FIG. 1, the fourth electrode finger 14b extending from the fourth busbar 14a toward the third busbar 13a is positioned under the first electrode finger 11b. In this manner, the first IDT electrode 7 and the second IDT electrode 8 are displaced from each other by, for example, about λ/2.

A first conductive connector 15 that electrically connects the first busbar 11a and the third busbar 13a is provided in the piezoelectric layer 6. The first conductive connector 15 passes through the piezoelectric layer 6. A second conductive connector 16 that electrically connects the second busbar 12a and the fourth busbar 14a is provided in the piezoelectric layer 6. The second conductive connector 16 also passes through the piezoelectric layer 6.

The first busbar 11a and the third busbar 13a are electrically connected to each other so as to have the same potential. Similarly, the second busbar 12a and the fourth busbar 14a are electrically connected to each other so as to have the same potential.

In a plan view, the corners of the first and second conductive connectors 15 and 16 are preferably rounded. It is thus less likely that the first and second conductive connectors 15 and 16, the first and second busbars 11a and 12a, and the third and fourth busbars 13a and 14a crack.

As shown in FIG. 2B, the first conductive connector 15 includes first and second side surfaces 15a and 15b. The first side surface 15a is located on the side of the first electrode finger 11b. The first conductive connector 15 is tapered in the cross section in FIG. 2B. That is, the distance between the first side surface 15a and the second side surface 15b becomes gradually smaller in the direction from the first busbar 11a toward the third busbar 13a. In this manner, the first and second side surfaces 15a and 15b are tilted. The second conductive connector 16 also includes first and second side surfaces that are tilted similarly to the first and second side surfaces 15a and 15b.

The first and second side surfaces 15a and 15b are structured as tilted surfaces so that the first conductive connector 15 is tapered, as discussed above. For this reason, as well, the first busbar 11a connected to the first conductive connector 15 is unlikely to crack. Similarly, the second busbar 12a is also unlikely to crack.

The first conductive connector 15 is disposed in a region where the first and third busbars 11a and 13a match or overlap each other, while the second conductive connector 16 is disposed in a region where the second and fourth busbars 12a and 14a match or overlap each other, as described above. In the present invention, however, the first conductive connector 15 may be disposed outside the region where the first and third busbars 11a and 13a match or overlap each other in a plan view, while the second conductive connector 16 may be disposed outside the region where the second and fourth busbars 12a and 14a match or overlap each other in a plan view. That is, the first and second conductive connectors 15 and 16 may be provided as first and second wiring electrodes located outside the first through fourth busbars 11a through 14a.

In the acoustic wave device 1, with the application of an AC electric field to between the first and third comb-shaped electrodes 11 and 13 and the second and fourth comb-shaped electrodes 12 and 14, the first IDT electrode 7 and the second IDT electrode 8 can be driven in opposite phases. For example, as shown in FIG. 2A, the first and second electrode fingers 11b and 12b of the first IDT electrode 7 and the third and fourth electrode fingers 13b and 14b of the second IDT electrode 8 that overlap each other with the piezoelectric layer 6 interposed therebetween can be driven to have potentials of opposite polarities. This can eliminate the need to extend wiring to provide opposite-phase driving to the outside of the region where the first and second IDT electrodes 7 and 8 are disposed. The acoustic wave device 1 can thus be reduced in size.

Additionally, in the acoustic wave device 1, since the first busbar 11a and the third busbar 13a have the same potential, no excitation occurs therebetween. Similarly, since the second busbar 12a and the fourth busbar 14a have the same potential, no excitation occurs therebetween. It is thus unlikely to cause degradation of the characteristics due to unwanted excitation.

In the acoustic wave device 1 of the first example embodiment, the silicon nitride film 4 is a high acoustic velocity material layer, while the silicon oxide film 5 is a low acoustic velocity material layer, as discussed above.

The high acoustic velocity material can be defined as follows. The acoustic velocity of a bulk wave propagating through the high acoustic velocity material is higher than that of an acoustic wave propagating through the piezoelectric layer 6. The high acoustic velocity material is not limited to silicon nitride. Various other materials may be used such as, for example, aluminum oxide, silicon carbide, silicon oxynitride, silicon, sapphire, lithium tantalate, lithium niobate, quartz, alumina, zirconia, cordierite, mullite, steatite, forsterite, magnesia, a DLC (diamond-like carbon) film or diamond, a medium including any of the above-described materials as a principal component, and a medium including a mixture of any of the above-described materials as a principal component.

The low acoustic velocity material can be defined as follows. The acoustic velocity of a bulk wave propagating through the low acoustic velocity material is lower than that of a bulk wave propagating through the piezoelectric layer 6. As the low acoustic velocity material, apart from silicon oxide, various other materials may be used such as, for example, glass, silicon oxynitride, tantalum oxide, a compound obtained by adding fluorine, carbon, boron, hydrogen, or silanol to silicon oxide, and a medium including any of the above-described materials as a principal component.

Figure 3A:
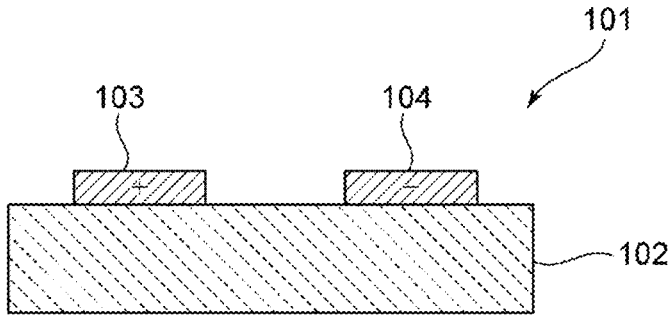
FIG. 3A is a partial elevational cross-sectional view schematically illustrating a known acoustic wave device.
Figure 3B:
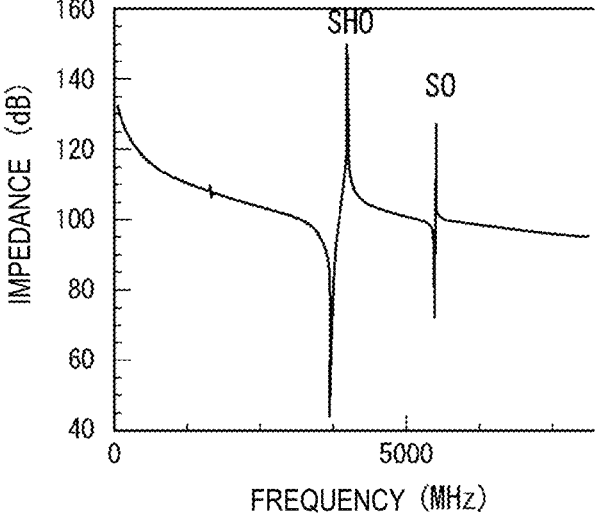
FIG. 3B is a graph illustrating the resonance characteristics of the known acoustic wave device.

FIG. 3A illustrates the relationship between comb-shaped electrodes 103 and 104 provided on a piezoelectric film 102 of a known acoustic wave device 101. In the known acoustic wave device 101, as illustrated in FIG. 3B, the resonance characteristics in the SH0 mode and the S0 mode are observed.

As the structure of the first example embodiment, an acoustic wave device was provided by a specimen made with the following specific design conditions.

The wavelength λ determined by the electrode finger pitch of the first and second IDT electrodes 7 and 8 was set to about 1 μm.

As the piezoelectric layer 6, 50°-Y-cut LiTaO$_3$ was used. The film thickness of the piezoelectric layer 6 made of LiTaO$_3$ was about 0.3λ.

As the support substrate 2, a support substrate having a silicon (100) plane was used.

The X axis of LiTaO$_3$ and the direction of the Si(110) plane were in parallel or substantially in parallel with each other.

As the first and second IDT electrodes 7 and 8, Al was used. The film thickness of the first IDT electrode 7 was about 0.07λ, while that of the second IDT electrode 8 was about 0.12λ. The duty ratio of the first and second IDT electrodes 7 and 8 was about 0.5.

The film thickness of the silicon nitride film 4 was about 0.075λ.

The film thickness of the silicon oxide film 5 was about 0.37λ.

Figure 4A:
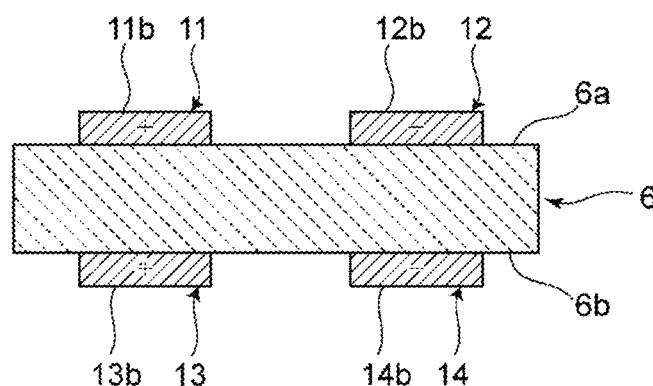
FIG. 4A is a partial elevational cross-sectional view for explaining the potentials of IDT electrodes provided on both main surfaces of an acoustic wave device when the IDT electrodes are driven in the same phase.
Figure 4B:
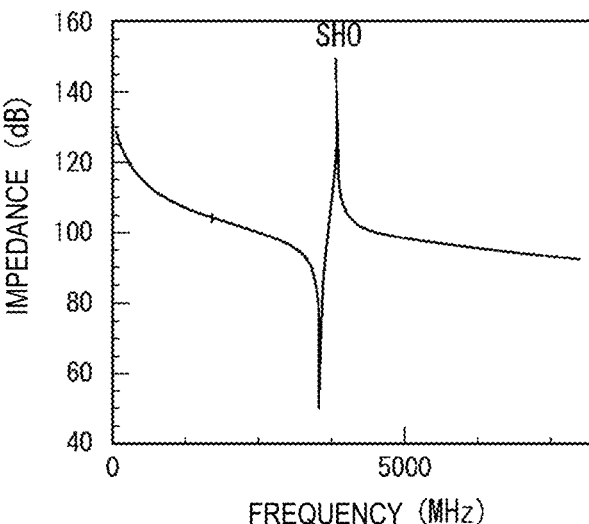
FIG. 4B is a graph illustrating the resonance characteristics of this acoustic wave device.

FIG. 4A is a partial elevational cross-sectional view of a structure in which the first and second comb-shaped electrodes 11 and 12 are disposed on the first main surface 6a of the piezoelectric layer 6 and the third and fourth comb-shaped electrodes 13 and 14 are disposed on the second main surface 6b. In this structure, the first comb-shaped electrode 11 and the third comb-shaped electrode 13 facing each other with the piezoelectric layer 6 interposed therebetween have the same potential, while the second comb-shaped electrode 12 and the fourth comb-shaped electrode 14 facing each other with the piezoelectric layer 6 interposed therebetween have the same potential. In this case, the resonance characteristics of the SH0 mode are obtained and almost no resonance response in the S0 mode is observed, as shown in FIG. 4B. This can reduce the size of the acoustic wave device.

When the SH0 mode is used as described above, for example, it is preferable that the film thickness of the piezoelectric layer 6 is about $1\lambda$ or smaller, the cut-angles of LiTaO$_3$ are about $-10°$ to about $70°$, that is, (about $-10°$ to about $70°$)-Y-cut X-propagation LiTaO$_3$ is used, the film thickness of the first and second IDT electrodes 7 and 8 made of Al is about $0.15\lambda$ or smaller, and the duty ratio of the first and second IDT electrodes 7 and 8 is about 0.2 to about 0.8. With these ranges, high-order modes outside the pass band can be reduced more effectively while the SH0 mode is being used.

Figure 5A:
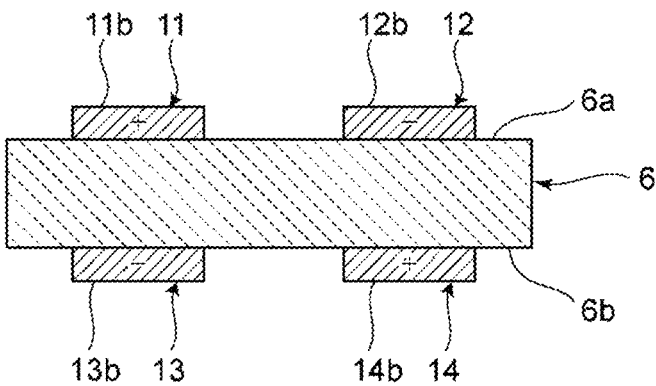
FIG. 5A is a partial elevational cross-sectional view for explaining the potentials of IDT electrodes provided on both main surfaces of the acoustic wave device according to the first example embodiment of the present invention when the IDT electrodes are driven in opposite phases.

As shown in FIG. 5A, in the first example embodiment, the first and second comb-shaped electrodes 11 and 12 are disposed on the first main surface 6a of the piezoelectric layer 6, while the third and fourth comb-shaped electrodes 13 and 14 are disposed on the second main surface 6b. The potential of the first comb-shaped electrode 11 and that of the third comb-shaped electrode 13 are opposite polarities, while the potential of the second comb-shaped electrode 12 and that of the fourth comb-shaped electrode 14 are opposite polarities. In this case, the resonance characteristics of the S0 mode are obtained and no resonance response in the SH0 mode is observed, as shown in FIG. 5B.

In the case of the first example embodiment, with the above-described configuration, the resonance characteristics of the S0 mode can be effectively obtained.

Figure 5B:
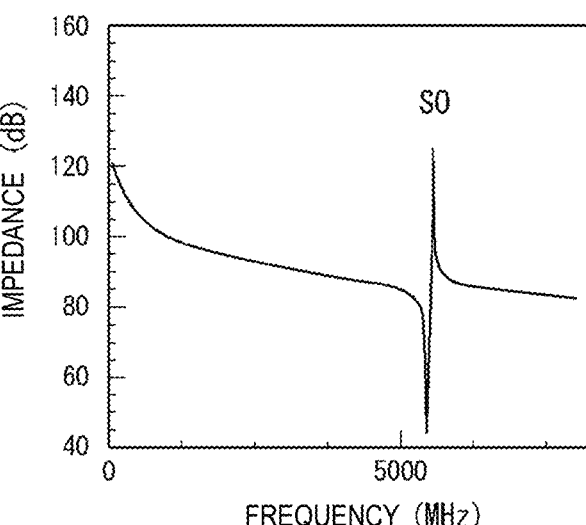
FIG. 5B is a graph illustrating the resonance characteristics of this acoustic wave device.

In the first example embodiment of the present invention, the resonance characteristics shown in FIG. 5B can be used. In another mode, for example, the acoustic wave device 1 of the first example embodiment may be used together with the acoustic wave device shown in FIGS. 4A and 4B. This makes it possible to provide filters, for example, having various characteristics.

Figure 6:
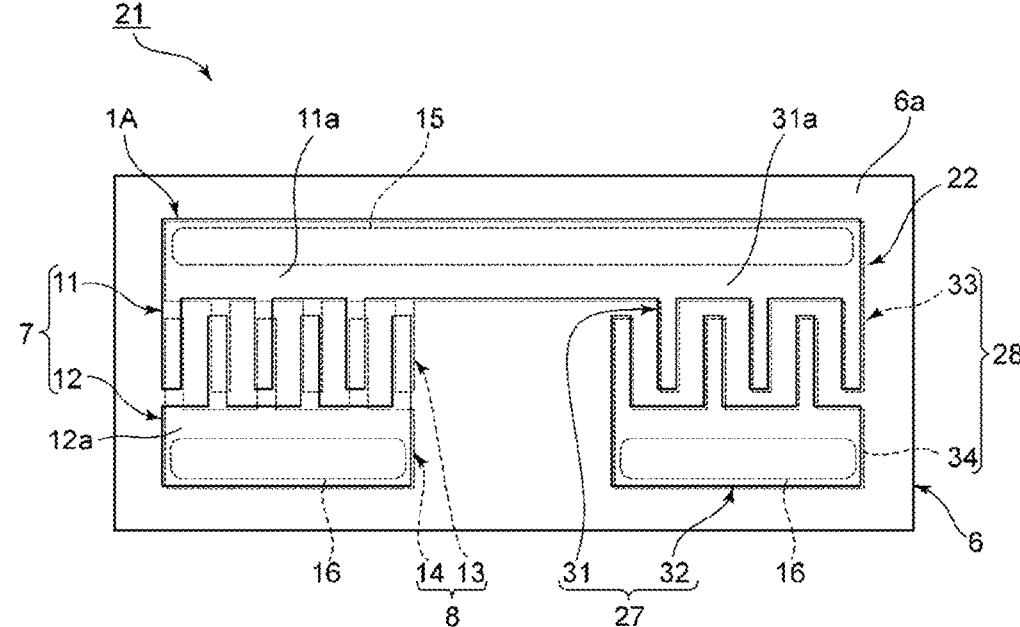
FIG. 6 is a plan view of an acoustic wave device according to a second example embodiment of the present invention.

FIG. 6 is a plan view of an acoustic wave device according to a second example embodiment of the present invention.

An acoustic wave device 21 according to the second example embodiment includes a piezoelectric layer 6. As in the first example embodiment, a support substrate 2 and an intermediate layer 3 are disposed below the piezoelectric layer 6 (see FIGS. 2A and 2B).

In the acoustic wave device 21, a first IDT electrode 7 of a first acoustic wave element 1A and a first IDT electrode 27 of a second acoustic wave element 22 are disposed on the first main surface 6a of the piezoelectric layer 6. The electrode structure of the acoustic wave element 1A is the same as or similar to that of the acoustic wave device 1. Accordingly, under the first IDT electrode 7, a second IDT electrode 8 that is displaced from the first IDT electrode 7 by, for example, about $\lambda/2$ in the acoustic wave propagating direction is disposed.

The second acoustic wave element 22 includes the first IDT electrode 27 and a second IDT electrode 28 which is disposed on the second main surface of the piezoelectric layer 6. The first IDT electrode 27 and the second IDT electrode 28 match or overlap each other with the piezoelectric layer 6 interposed therebetween. That is, the first IDT electrode 27 and the second IDT electrode 28 are not displaced from each other in the acoustic wave propagating direction.

More specifically, under first and second comb-shaped electrodes 31 and 32, third and fourth comb-shaped electrodes 33 and 34 are disposed to match or overlap the first and second comb-shaped electrodes 31 and 32 with the piezoelectric layer 6 interposed therebetween. The first busbar 11a of the first IDT electrode 7 is connected to a first busbar 31a of the second acoustic wave element 22. With this configuration, the first acoustic wave element 1A and the second acoustic wave element 22 are connected in parallel with each other.

A first conductive connector 15 extends to the second acoustic wave element 22.

In the acoustic wave device 21, the acoustic wave element 1A that is driven in opposite phases and the second acoustic wave element 22 that is driven in the same phase are connected in parallel with each other.

In this manner, the second acoustic wave element 22 driven in the same phase may be connected in parallel with the first acoustic wave element 1A structured in accordance with an example embodiment of the present invention.

Figure 7:
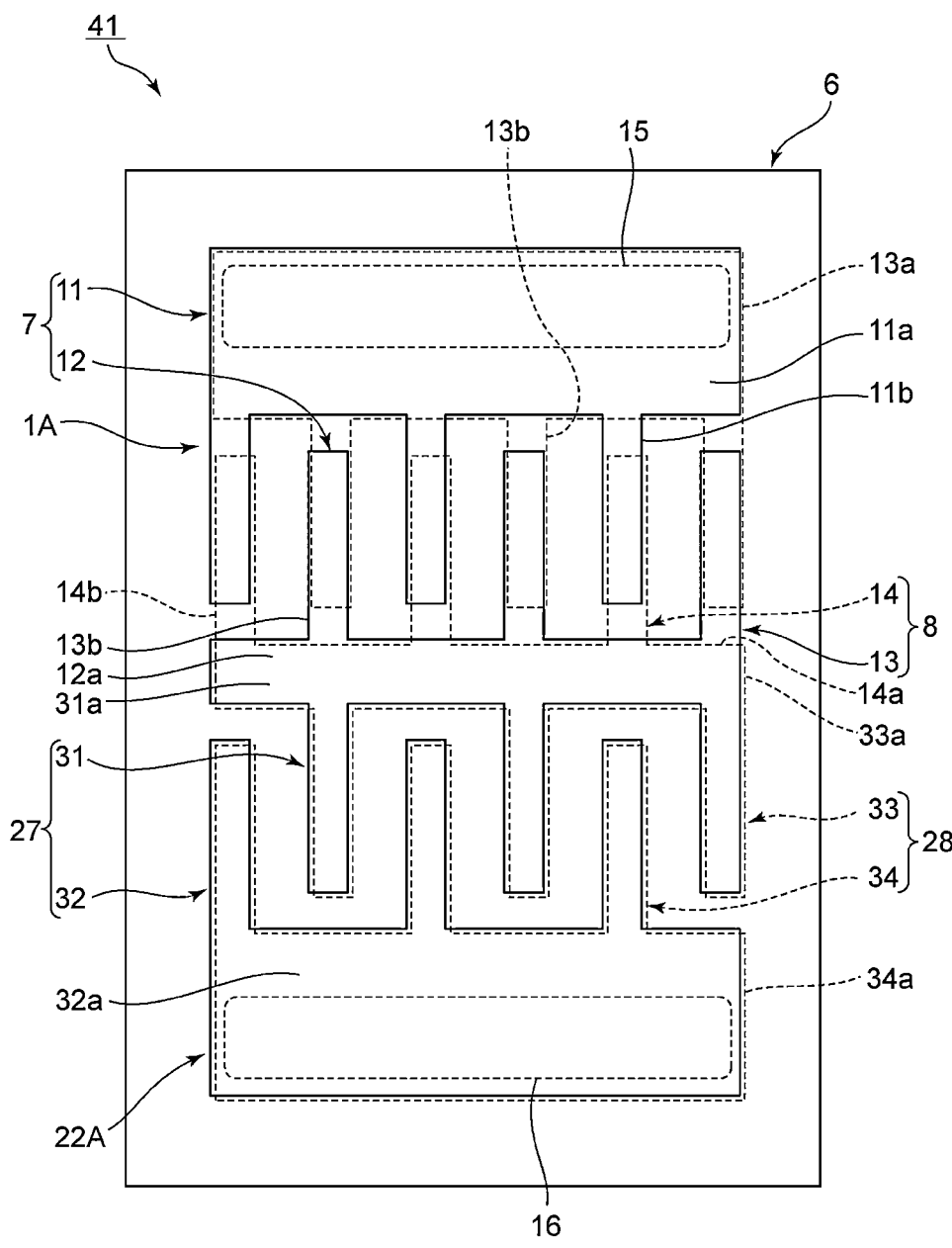
FIG. 7 is a plan view of an acoustic wave device according to a third example embodiment of the present invention.

FIG. 7 is a plan view of an acoustic wave device according to a third example embodiment of the present invention. In an acoustic wave device 41, IDT electrodes are formed on both main surfaces of the piezoelectric layer 6. With this configuration, a first acoustic wave element 1A and a second acoustic wave element 22A are provided. The structure of the IDT electrodes of the first acoustic wave element 1A and that of the second acoustic wave element 22A are respectively the same as or similar to that of the first acoustic wave element 1A and that of the second acoustic wave element 22 shown in FIG. 6. The acoustic wave device 41 is different from the acoustic wave device 21 in FIG. 6 in that the second acoustic wave element 22A is connected in series with the first acoustic wave element 1A. That is, the second busbar 12a of the first acoustic wave element 1A and a first busbar 31a of the second acoustic wave element 22A are the same busbar. The fourth busbar 14a of the first acoustic wave element 1A and a third busbar 33a of the second acoustic wave element 22A are the same busbar.

In the second acoustic wave element 22A, as well, the second and fourth busbars 32a and 34a are electrically connected to each other by the second conductive connector 16.

As in the acoustic wave device 41, it may be possible to utilize a structure in which the second acoustic wave element 22A driven in the same phase is connected in series with the first acoustic wave element 1A structured similarly to the first example embodiment.

Figure 8:
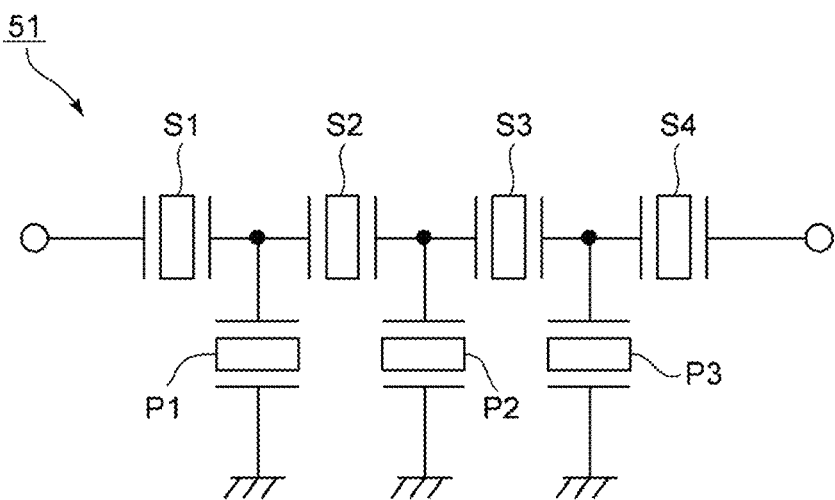
FIG. 8 is a circuit diagram of a ladder filter including an acoustic wave device according to an example embodiment of the present invention.

As in the acoustic wave device 21 illustrated in FIG. 6 or the acoustic wave device 41 illustrated in FIG. 7, a structure in which an acoustic wave element driven in the same phase is connected in series with or in parallel with an acoustic wave element may be provided. Such a structure can be used suitably for a ladder filter shown in FIG. 8, for example.

A ladder filter 51 includes plural series arm resonators S1 through S4 and plural parallel arm resonators P1 through P3. In the above-configured ladder filter 51, the acoustic wave device 21 illustrated in FIG. 6 or the acoustic wave device 41 illustrated in FIG. 7 may be used for the series arm resonator S1 and the parallel arm resonator P1, for example.

For example, when a ladder filter is provided by using the in-phase driving second acoustic wave element 22 or 22A, the first acoustic wave element 1A is used for at least one of the parallel arm resonators P1 through P3. In this case, the S0 mode having a smaller fractional bandwidth than the SH0 mode is used for a parallel arm, thus improving the attenuation characteristics on the lower frequency side of the pass band.

In another mode, when a ladder filter is provided by using the in-phase driving second acoustic wave element 22 or 22A, the first acoustic wave element 1A is used for at least one of the series arm resonators S1 through S4. In this case, the S0 mode having a smaller fractional bandwidth than the SH0 mode is used for a series arm, thus improving the attenuation characteristics on the higher frequency side of the pass band.

In another mode, when a ladder filter is provided by using the in-phase driving second acoustic wave element 22 or 22A, the first acoustic wave element 1A is used for at least one of the series arm resonators S1 through S4 and at least one of the parallel arm resonators P1 through P3. In this case, the attenuation characteristics on the higher frequency side and those on the lower frequency side of the pass band can be improved.

Alternatively, the ladder filter 51 may be provided by using the acoustic wave device 1 of the first example embodiment. In this case, the ladder filter 51 uses the S0 mode having a frequency band higher than the SH0 mode, thus increasing the frequency used in the filter.

Figure 9:
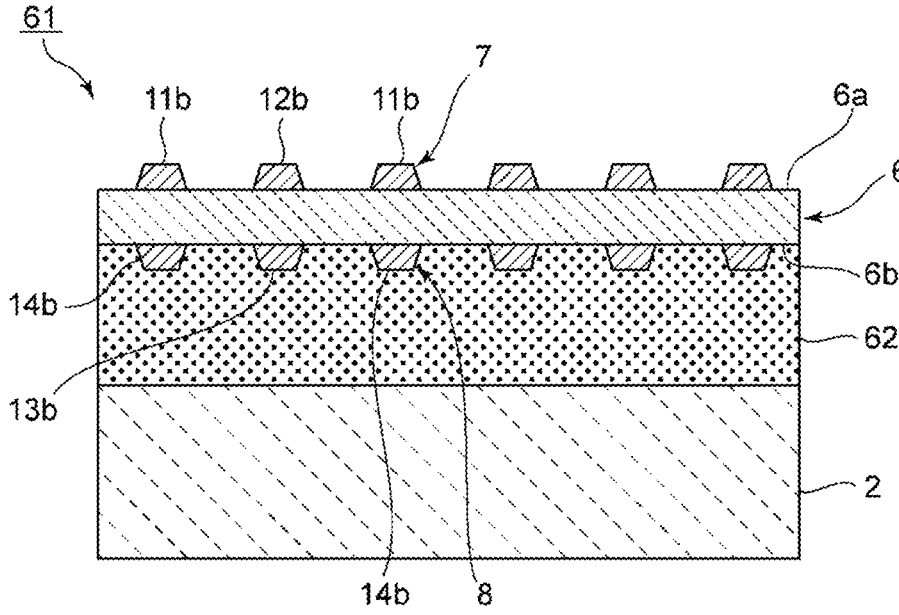
FIG. 9 is an elevational cross-sectional view of an acoustic wave device according to a fourth example embodiment of the present invention.

FIG. 9 is an elevational cross-sectional view of an acoustic wave device according to a fourth example embodiment of the present invention. In an acoustic wave device 61, an intermediate layer 62 is provided between a support substrate 2 and a piezoelectric layer 6. The intermediate layer 62 is made of, for example, silicon oxide. The support substrate 2 is made of a high acoustic velocity material and is thus a high acoustic velocity substrate. The configurations of the other elements of the acoustic wave device 61 are the same as or similar to those of the acoustic wave device 1.

In this manner, the intermediate layer 62 may be provided as a layer made of a low acoustic velocity material. In this case, as well, since the support substrate 2 is made of a high acoustic velocity material, acoustic wave energy excited in the piezoelectric layer 6 can be trapped within the piezoelectric layer 6 effectively.

In example embodiments of the present invention, the piezoelectric layer 6 may be stacked directly on the support substrate 2. In this case, if the support substrate 2 is made of a high acoustic velocity material, acoustic wave energy can be trapped within the piezoelectric layer 6 effectively. That is, in FIG. 9, the intermediate layer 62 may be omitted.

Figure 10:
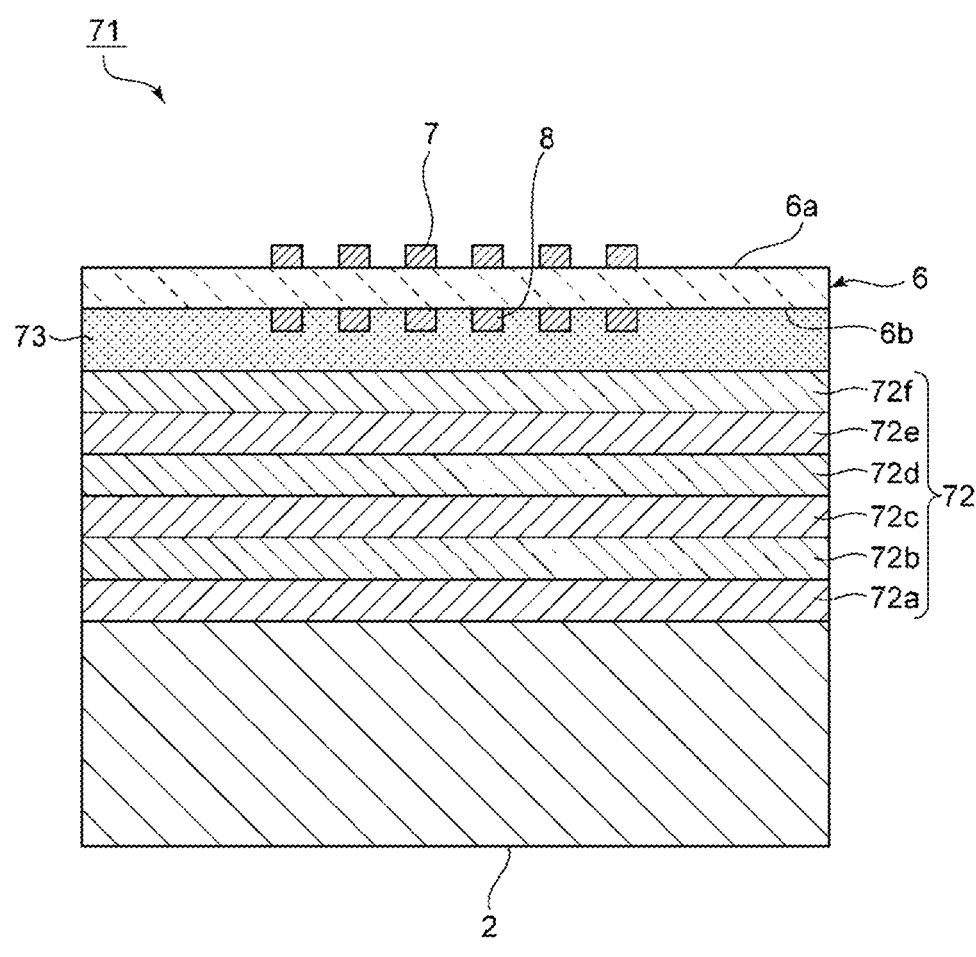
FIG. 10 is an elevational cross-sectional view of an acoustic wave device according to a fifth example embodiment of the present invention.

FIG. 10 is an elevational cross-sectional view of an acoustic wave device according to a fifth example embodiment of the present invention. In an acoustic wave device 71, an acoustic reflective layer 72 and a silicon oxide film 73 are stacked between a support substrate 2 and a piezoelectric layer 6. The silicon oxide film 73 may be omitted.

The acoustic reflective layer 72 is a multilayer body including high acoustic impedance layers 72a, 72c, and 72e and low acoustic impedance layers 72b, 72d, and 72f. The high acoustic impedance layers 72a, 72c, and 72e are made of a high acoustic impedance material of a relatively high acoustic impedance. The low acoustic impedance layers 72b, 72d, and 72f are made of a low acoustic impedance material of a relatively low acoustic impedance. A suitable dielectric body or insulator that satisfies the above-described relationship in the acoustic impedance level may be used as the low acoustic impedance material and the high acoustic impedance material.

The above-described acoustic reflective layer 72 may be included as the intermediate layer. In the acoustic wave device 71, the piezoelectric layer 6 and first and second IDT electrodes 7 and 8 are configured the same as or similarly to those in the first example embodiment.

Figure 11:
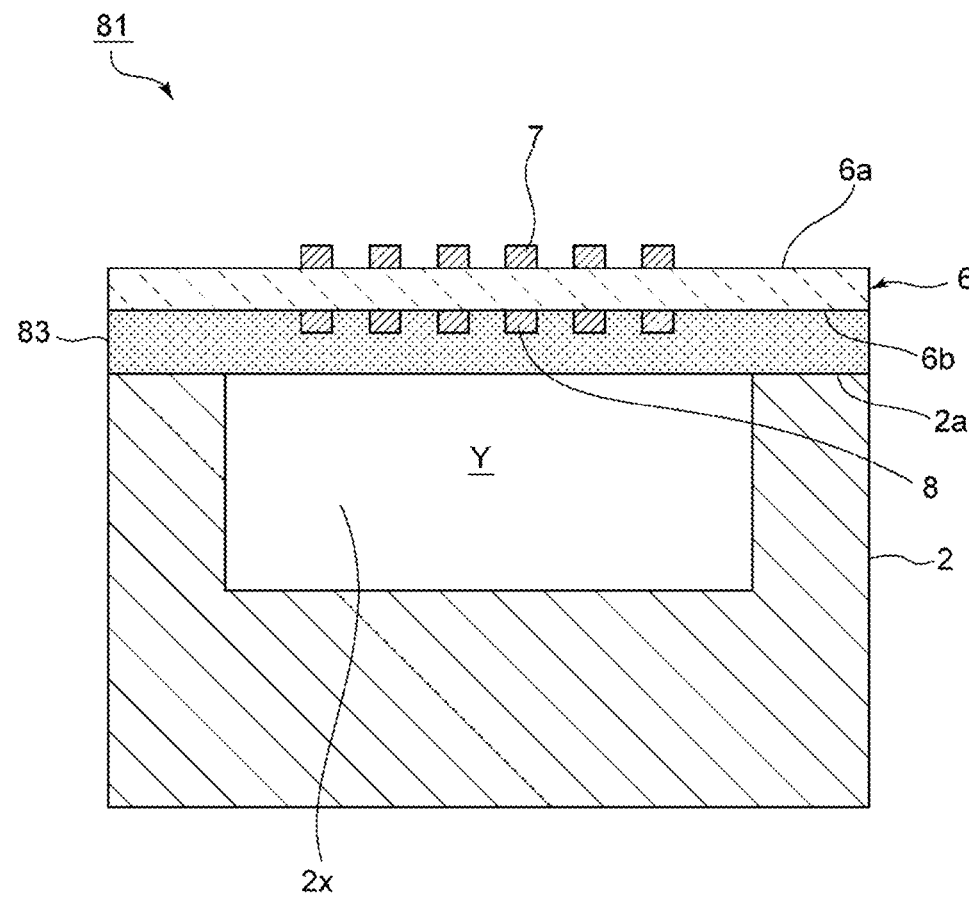
FIG. 11 is an elevational cross-sectional view of an acoustic wave device according to a sixth example embodiment of the present invention.

FIG. 11 is an elevational cross-sectional view of an acoustic wave device according to a sixth example embodiment of the present invention. In an acoustic wave device 81, a silicon oxide film 83 and a support substrate 2 are stacked on each other. A recessed portion 2x open above is provided in the support substrate 2. The silicon oxide film 83 is stacked on a top surface 2a of the support substrate 2. The silicon oxide film 83 may be omitted. A piezoelectric layer 6 is stacked on the top surface 2a of the support substrate 2 directly or indirectly.

The above-described recessed portion 2x is closed by the silicon oxide film 83 and the piezoelectric layer 6, thus providing a cavity Y. First and second IDT electrodes 7 and 8 are located above the cavity Y.

In the sixth example embodiment, since the first and second IDT electrodes 7 and 8 are located above the cavity Y, a membrane acoustic wave device can be provided. A structure in which the cavity Y is provided under the piezoelectric layer 6 may be provided.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
   a support substrate;
   a piezoelectric layer directly or indirectly stacked on the support substrate and including first and second main surfaces facing each other;
   a first IDT electrode on the first main surface of the piezoelectric layer; and
   a second IDT electrode on the second main surface of the piezoelectric layer; wherein
   the first IDT electrode includes first and second busbars facing each other, a plurality of first electrode fingers connected to the first busbar, and a plurality of second electrode fingers connected to the second busbar;
   the second IDT electrode includes third and fourth busbars facing each other, a plurality of third electrode fingers connected to the third busbar, and a plurality of fourth electrode fingers connected to the fourth busbar;
   the first busbar and the third busbar face each other with the piezoelectric layer interposed therebetween, and the second busbar and the fourth busbar face each other with the piezoelectric layer interposed therebetween;
   the first electrode fingers and the fourth electrode fingers overlap each other with the piezoelectric layer interposed therebetween, and the second electrode fingers and the third electrode fingers overlap each other with the piezoelectric layer interposed therebetween;
   a polarity of a potential of the first electrode fingers and a polarity of a potential of the fourth electrode fingers are opposite to each other; and
   a polarity of a potential of the second electrode fingers and a polarity of a potential of the third electrode fingers are opposite to each other.

2. An acoustic wave device comprising:

a support substrate;

a piezoelectric layer directly or indirectly stacked on the support substrate and including first and second main surfaces facing each other;

a first IDT electrode on the first main surface of the piezoelectric layer, and a second IDT electrode on the second main surface of the piezoelectric layer; wherein each of the first IDT electrode and the second IDT electrode includes two comb-shaped electrodes interdigitated with each other, each of the comb-shaped electrodes including a plurality of electrode fingers and a busbar to which the plurality of electrode fingers are connected;

the first IDT electrode and the second IDT electrode at least partially face each other with the piezoelectric layer interposed therebetween;

in an electrode finger of the first IDT electrode and an electrode finger of the second IDT electrode which face each other with the piezoelectric layer interposed therebetween, a polarity of a potential of the electrode finger of the first IDT electrode and a polarity of a potential of the electrode finger of the second IDT electrode are opposite to each other;

the first IDT electrode and the second IDT electrode are displaced from each other by about $\lambda/2$ in an acoustic wave propagating direction, where $\lambda$ is a wavelength defined by a pitch of the electrode fingers; and in a busbar of the first IDT electrode and a busbar of the second IDT electrode which face each other with the piezoelectric layer interposed therebetween, a polarity of a potential of the busbar of the first IDT electrode and a polarity of a potential of the busbar of the second IDT electrode are the same.

3. The acoustic wave device according to claim 1, further comprising:

a first conductive connector electrically connecting the first busbar and the third busbar; and a second conductive connector electrically connecting the second busbar and the fourth busbar.

4. The acoustic wave device according to claim 3, wherein the first conductive connector passes through the piezoelectric layer so as to electrically connect the first busbar and the third busbar; and the second conductive connector passes through the piezoelectric layer so as to electrically connect the second busbar and the fourth busbar.

5. The acoustic wave device according to claim 3, wherein:

the first conductive connector includes a first wiring electrode provided outside a region where the first busbar and the third busbar match each other in a plan view; and the second conductive connector includes a second wiring electrode provided outside a region where the second busbar and the fourth busbar match each other in a plan view.

6. The acoustic wave device according to claim 4, wherein at least one of the first and second conductive connectors includes first and second side surfaces, the first side surface being located on a side of the first through fourth electrode fingers, the second side surface facing the first side surface; and the first and second side surfaces are tilted such that a dimension between the first side surface and the second side surface becomes smaller in a direction from the first or second busbar toward the third or fourth busbar.

7. The acoustic wave device according to claim 4, wherein corners of the first and second conductive connectors are rounded in a plan view.

8. The acoustic wave device according to claim 1, further comprising an intermediate layer between the piezoelectric layer and the support substrate.

9. The acoustic wave device according to claim 2, further comprising an intermediate layer between the piezoelectric layer and the support substrate.

10. The acoustic wave device according to claim 8, wherein the support substrate is a high acoustic velocity substrate made of a high acoustic velocity material, an acoustic velocity of a bulk wave propagating through the high acoustic velocity material being higher than an acoustic velocity of an acoustic wave propagating through the piezoelectric layer.

11. The acoustic wave device according to claim 9, wherein the support substrate is a high acoustic velocity substrate made of a high acoustic velocity material, an acoustic velocity of a bulk wave propagating through the high acoustic velocity material being higher than an acoustic velocity of an acoustic wave propagating through the piezoelectric layer.

12. The acoustic wave device according to claim 8, wherein the intermediate layer includes a high acoustic velocity material layer made of a high acoustic velocity material, an acoustic velocity of a bulk wave propagating through the high acoustic velocity material being higher than an acoustic velocity of an acoustic wave propagating through the piezoelectric layer.

13. The acoustic wave device according to claim 9, wherein the intermediate layer includes a high acoustic velocity material layer made of a high acoustic velocity material, an acoustic velocity of a bulk wave propagating through the high acoustic velocity material being higher than an acoustic velocity of an acoustic wave propagating through the piezoelectric layer.

14. The acoustic wave device according to claim 12, wherein the intermediate layer includes a low acoustic velocity material layer provided between the high acoustic velocity material layer and the support substrate and which is made of a low acoustic velocity material, an acoustic velocity of a bulk wave propagating through the low acoustic velocity material being lower than an acoustic velocity of a bulk wave propagating through the piezoelectric layer.

15. The acoustic wave device according to claim 13, wherein the intermediate layer includes a low acoustic velocity material layer provided between the high acoustic velocity material layer and the support substrate and which is made of a low acoustic velocity material, an acoustic velocity of a bulk wave propagating through the low acoustic velocity material being lower than an acoustic velocity of a bulk wave propagating through the piezoelectric layer.

16. An acoustic wave device comprising:

a first acoustic wave element; and a second acoustic wave element connected in series with or in parallel with the first acoustic wave element; wherein the first acoustic wave element is the acoustic wave device according to claim 1; and the second acoustic wave element includes a support substrate, a piezoelectric layer, and first and second IDT electrodes;

the piezoelectric layer is on the support substrate;

the first IDT electrode is on a first main surface of the piezoelectric layer;

the second IDT electrode is on a second main surface of the piezoelectric layer; and the first IDT electrode and the second IDT electrode of the second acoustic wave element match or overlap each other with the piezoelectric layer interposed therebetween.

17. The acoustic wave device according to claim 15, wherein, in a ladder filter including parallel arm resonators and series arm resonators, at least one of the parallel arm resonators and the series arm resonators is the first acoustic wave element, and among the parallel arm resonators and the series arm resonators, a parallel arm resonator or a series arm resonator is the second acoustic wave element.

18. An acoustic wave device comprising:

a first acoustic wave element; and a second acoustic wave element connected in series with or in parallel with the first acoustic wave element; wherein the first acoustic wave element is the acoustic wave device according to claim 2; and the second acoustic wave element includes a support substrate, a piezoelectric layer, and first and second IDT electrodes;

the piezoelectric layer is on the support substrate;

the first IDT electrode is on a first main surface of the piezoelectric layer;

the second IDT electrode is on a second main surface of the piezoelectric layer; and the first IDT electrode and the second IDT electrode of the second acoustic wave element match or overlap each other with the piezoelectric layer interposed therebetween.

19. The acoustic wave device according to claim 18, wherein, in a ladder filter including parallel arm resonators and series arm resonators, at least one of the parallel arm resonators and the series arm resonators is the first acoustic wave element, and among the parallel arm resonators and the series arm resonators, a parallel arm resonator or a series arm resonator is the second acoustic wave element.

* * * * *